(12) United States Patent
Yamamura

(10) Patent No.: US 7,203,128 B2
(45) Date of Patent: Apr. 10, 2007

(54) FERROELECTRIC MEMORY DEVICE AND ELECTRONIC APPARATUS

(75) Inventor: Mitsuhiro Yamamura, Nagano (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/170,682

(22) Filed: Jun. 29, 2005

(65) Prior Publication Data
US 2006/0023485 A1 Feb. 2, 2006

(30) Foreign Application Priority Data
Jul. 14, 2004 (JP) ............................. 2004-207777

(51) Int. Cl.
*G11C 8/18* (2006.01)
(52) U.S. Cl. ............................. 365/233.5; 365/189.04; 365/65; 365/117; 365/145
(58) Field of Classification Search ................. 365/65, 365/102, 117, 145, 159, 185.21, 189.07, 194, 365/233.5, 64, 149, 189.04
See application file for complete search history.

(56) References Cited

U.S. PATENT DOCUMENTS

| | | | | |
|---|---|---|---|---|
| 2,876,436 A | * | 3/1959 | Anderson | 365/145 |
| 5,038,323 A | * | 8/1991 | Schwee | 365/145 |
| 5,677,865 A | * | 10/1997 | Seyyedy | 365/145 |
| 5,721,699 A | * | 2/1998 | DeVilbiss | 365/145 |
| 5,926,412 A | * | 7/1999 | Evans et al. | 365/145 |
| 2005/0122818 A1 | * | 6/2005 | Yamamura | 365/222 |
| 2006/0013033 A1 | * | 1/2006 | Yamamura | 365/145 |

FOREIGN PATENT DOCUMENTS

| | | |
|---|---|---|
| JP | 2002-100183 | 4/2002 |
| JP | 2003-242772 | 8/2003 |
| JP | 2005-141833 | 6/2005 |

OTHER PUBLICATIONS

English machine translation of JP2003-242772 retreived from PAJ.*

* cited by examiner

*Primary Examiner*—Richard T. Elms
*Assistant Examiner*—Alexander Sofocleous
(74) *Attorney, Agent, or Firm*—Harness, Dickey & Pierce, P.L.C.

(57) ABSTRACT

A ferroelectric memory device characterized in comprising: a voltage source for generating a predetermined voltage; a first bit line and a second bit line; a first ferroelectric capacitor having one end electrically connected to the first bit line; a first resistance provided between the first bit line and the voltage source; a second ferroelectric capacitor having one end electrically connected to the second bit line; a second resistance provided between the second bit line and the voltage source; and a sense amplifier that judges data written in the first ferroelectric capacitor based on a potential on the first bit line, according to a timing at which a potential on the second bit line changes when the predetermined voltage is supplied to the first bit line and the second bit line.

3 Claims, 8 Drawing Sheets

PRIOR ART

PRIOR ART

PRIOR ART

PRIOR ART

FERROELECTRIC MEMORY DEVICE AND ELECTRONIC APPARATUS

RELATED APPLICATIONS

This application claims priority to Japanese Patent Application No. 2004-207777 filed Jul. 14, 2004 which is hereby expressly incorporated by reference herein in its entirety.

BACKGROUND

1. Technical Field

The present invention relates to ferroelectric memory devices and electronic apparatuses. More particularly, the present invention relates to ferroelectric memory devices with few deterioration of ferroelectric.

2. Related Art

A conventional FeRAM is described in Japanese Laid-open Patent Application 2002-100183. A ferroelectric memory described in the aforementioned Patent Document 1 is equipped with a 0-level setting circuit provided in a preceding stage of a sense amplifier, for re-setting a signal on a lower potential side among binarized signals to 0V.

However, in the conventional FeRAM described in JP 2002-100183, a high voltage is impressed to its memory cell, and therefore there is a problem in that fatigue characteristics of the ferroelectric that compose the memory cell are substantially deteriorated. Also, because its circuit structure is complex, there are problems in that the readout operation requires a long time, and the operation speed lowers.

Accordingly, it is an object of the present invention to provide ferroelectric memory devices and electronic apparatuses, which can solve the problems described above. This object is achieved by combinations of the characteristics recited in independent claims in Scope of Patent Claims. Also, dependent claims further define advantageous concrete examples of the present invention.

SUMMARY

To solve the problems described above, in accordance with a first embodiment of the present invention, there is provided a ferroelectric memory device characterized in comprising: a voltage source for generating a predetermined voltage; a first bit line and a second bit line; a first ferroelectric capacitor having one end electrically connected to the first bit line; a first resistance provided between the first bit line and the voltage source; a first switch provided between the voltage source and the first bit line, for switching as to whether the predetermined voltage is to be supplied for a predetermined period to the first bit line through the first resistance; a second ferroelectric capacitor having one end electrically connected to the second bit line; a second resistance provided between the second bit line and the voltage source; a second switch provided between the voltage source and the second bit line, for switching as to whether the predetermined voltage is to be supplied for a predetermined period to the second bit line through the second resistance; and a sense amplifier that judges data written in the first ferroelectric capacitor based on a potential on the first bit line, according to a timing at which a potential on the second bit line changes when the predetermined voltage is supplied to the first bit line and the second bit line.

In the structure described above, the charge characteristic of the first bit line becomes substantially different according to data written in the first ferroelectric capacitor. In other words, a large readout potential difference can be obtained between data written in the first ferroelectric capacitor, such that data written in the first ferroelectric capacitor can be judged based on this potential difference. Accordingly, the structure described above can provide a ferroelectric memory device whose structure is considerably simple, and readout operation is stable.

Also, according to the structure described above, the operation of the sense amplifier can be started according to a timing at which a potential on the second bit line changes when the predetermined voltage is supplied to the first bit line and the second bit line. This timing is determined by the time constant of the second bit line, in other words, by the characteristics of the second resistance and the second ferroelectric capacitor connected to the second bit line. Then, for example, even when characteristics of the first resistance and the first ferroelectric capacitor, which affect the time constant of the first bit line, change, the time constant of the second bit line changes according to the aforementioned change. Therefore, the structure described above can provide a ferroelectric memory device that is capable of performing a stable readout operation even when the characteristics of the ferroelectric capacitor or the like change.

The ferroelectric memory device described above may preferably be further equipped with a waveform shaping section provided between the second bit line and the sense amplifier, for generating a potential signal of a shaped potential waveform on the second bit line, wherein the sense amplifier judges data written in the first ferroelectric capacitor based on a potential on the first bit line when a potential of the potential signal changes.

In the structure described above, the sense amplifier judges data written in the first ferroelectric capacitor based on a timing at which the potential of the potential waveform changes. The timing is determined by the operation to shape the potential waveform performed by the waveform shaping section. Accordingly, by the structure described above, the waveform shaping section can set the timing to any desired timing, such that the readout operation can be further stabilized.

The ferroelectric memory device described above may preferably be further equipped with: a third bit line; a third ferroelectric capacitor having one end electrically connected to the third bit line; a third resistance provided between the third bit line and the voltage source, and having a resistance value different from a resistance value of the first resistance; and a third switch provided between the voltage source and the third bit line, for switching as to whether the predetermined voltage is to be supplied for a predetermined period to the third bit line through the third resistance, wherein the sense amplifier compares, according to the timing, a potential on the first bit line with a potential on the third bit line when the predetermined voltage is supplied to the first bit line and the second bit line, to thereby judge data written in the first ferroelectric capacitor.

In the structure described above, the third bit line has a time constant different from that of the first bit line, and therefore the charge characteristic of the third bit line is different from the charge characteristic of the first bit line when a predetermined voltage is supplied from the voltage source. Then, the sense amplifier judges data written in the first ferroelectric capacitor based on the difference in the charge characteristics. In other words, the potential on the first bit line at that timing is different from the potential on the third bit line, and the sense amplifier can judge data written in the first ferroelectric capacitor based on the potential difference.

Accordingly, the structure described above can realize a stable readout operation with a considerably simple structure. Furthermore, even when the characteristics of the ferroelectric capacitor change due to fluctuations in the process, differences in the process, changes in the operation temperature, changes in the power supply voltage, a stable operation to readout the data can be realized.

In the ferroelectric memory device described above, data "0" may preferably be written in the third ferroelectric capacitor.

In the structure described above, to retain data "0" in the third ferroelectric capacitor, the potential on one end thereof is set to be higher than that on the other end. Then, when data written in the first ferroelectric capacitor is to be judged, a predetermined voltage is supplied to the third bit line for generating a reference voltage, and the predetermined voltage sets the potential on the one end of the third ferroelectric capacitor higher than that on the other end, whereby data "0" can be retained in the third ferroelectric capacitor. Accordingly, by the structure described above, reference voltage data can be retained in the third ferroelectric capacitor with a considerably simple structure.

In the ferroelectric memory device described above, the other end of the third ferroelectric capacitor may preferably be grounded.

In the structure described above, when data written in the first ferroelectric capacitor is to be judged, a predetermined voltage is supplied to the third bit line for generating a reference voltage, and the predetermined voltage is impressed to the third ferroelectric capacitor. In other words, in the structure described above, data "0" written as reference voltage data is not destroyed, and therefore a rewrite operation to the third ferroelectric capacitor does not have to be performed. Accordingly, by the structure described above, reference voltage data can be retained very easily in the third ferroelectric capacitor.

In the ferroelectric memory device described above, the value of the third resistance may preferably be greater than the value of the first resistance.

In the structure described above, the time constant of the third bit line becomes a value between the time constant of the first bit line when data "0" is written in the first ferroelectric capacitor and the time constant of the first bit line when data "1" is written therein. In other words, the potential on the third bit line when a predetermined voltage is supplied to the first bit line and the third bit line becomes to have a value between the potential on the first bit line when data "0" is written in the first ferroelectric capacitor and the potential on the first bit line when data "1" is written therein. Accordingly, by the structure described above, data written in the first ferroelectric capacitor can be accurately judged based on the potential on the third bit line.

In the structure described above, the potential on the third bit line when a predetermined voltage is supplied to the first bit line and the third bit line becomes generally a center value between the potential on the first bit line when data "0" is written in the first ferroelectric capacitor and the potential on the first bit line when data "1" is written therein. Accordingly, by the structure described above, the reference voltage can be given a greater margin, such that data written in the first ferroelectric capacitor can be more accurately judged.

In the ferroelectric memory device described above, the value of the third resistance may preferably be smaller than a resistance value that provides a time constant intermediate between the time constant of the first bit line when data "1" is written in the first ferroelectric capacitor and the time constant of the first bit line when data "0" is written in the first ferroelectric capacitor, but greater than a resistance value that provides a time constant of the first bit line which is given when data "0" is written in the first ferroelectric capacitor.

In the structure described above, the potential on the third bit line when a predetermined voltage is supplied to the first bit line and the third bit line may become a value smaller than the generally center value between the potential on the first bit line when data "0" is written in the first ferroelectric capacitor and the potential on the first bit line when data "1" is written therein. Accordingly, by the structure described above, even when the potential on the first bit line when data "1" is written lowers by the fatigue characteristics, the data written in the first ferroelectric capacitor can be accurately judged.

In the ferroelectric memory device described above, the first ferroelectric capacitor may preferably have a capacitance that is generally equal to that of the third ferroelectric capacitor.

In the ferroelectric memory device described above, the voltage source may preferably generate, as the predetermined voltage, a voltage that is generally the same as a drive voltage for driving the ferroelectric memory device. By this structure, a drive voltage source for generating a drive voltage can be used as the voltage source, such that a higher integration of the ferroelectric memory device can be achieved.

In the ferroelectric memory device described above, the voltage source may generate, as the predetermined voltage, a voltage between a coercive voltage of the ferroelectric capacitor and a drive voltage for driving the ferroelectric memory. By this structure, the voltage to be impressed to the ferroelectric composing the ferroelectric capacitor can be made smaller, such that deterioration of the ferroelectric characteristics, in particular, the fatigue characteristics can be suppressed. Consequently, a highly reliable ferroelectric memory device can be provided.

In the ferroelectric memory device described above, the voltage source may generate, as the predetermined voltage, a voltage smaller than a coercive voltage of the ferroelectric capacitor. By this structure, deterioration of the ferroelectric characteristics can be suppressed, and a ferroelectric memory that does not need a re-writing operation can be provided.

In the ferroelectric memory device described above, the switch may preferably be an n-type transistor having one of a source and a drain electrically connected to the voltage source or the bit line, and the other electrically connected to the resistance. By this, a ferroelectric memory device whose operation is further stabilized can be provided.

The ferroelectric memory device described above may preferably be further equipped with a control device that controls the switch such that, after the supply of a predetermined voltage to the bit line and the resistance is started, the supply is stopped before the bit line reaches a potential that is generally the same as the predetermined voltage. In this case, the ferroelectric memory device may preferably be further equipped with a plate line that is electrically connected to the other end of the ferroelectric capacitor, and a plate line control section that controls the potential on the plate line to be a ground potential while the predetermined voltage is being supplied to the bit line. By this structure, a large readout potential difference can be obtained in the readout operation, such that a ferroelectric memory device with a stable operation can be provided.

In accordance with a second embodiment of the present invention, there is provided an electronic apparatus characterized in comprising the ferroelectric memory device described above. It is noted here that the electronic apparatus refers to apparatuses in general that perform specified functions and are equipped with the memory device in accordance with the present invention, and is not particularly limited to any structure, but can include any apparatuses that require storage devices, such as, for example, computer devices in general that are equipped with the memory devices described above, portable telephones, PHSs, PDAs, electronic notebooks, IC cards, and the like.

DETAILED DESCRIPTION

The present invention is described below with reference to the accompanying drawings by means of embodiments. However, the embodiments below do not limit the invention concerning the scope of claimed invention, and all combinations of the characteristics described in the embodiments are not necessarily essential to the means for solution in accordance with the present invention.

Figure 1:
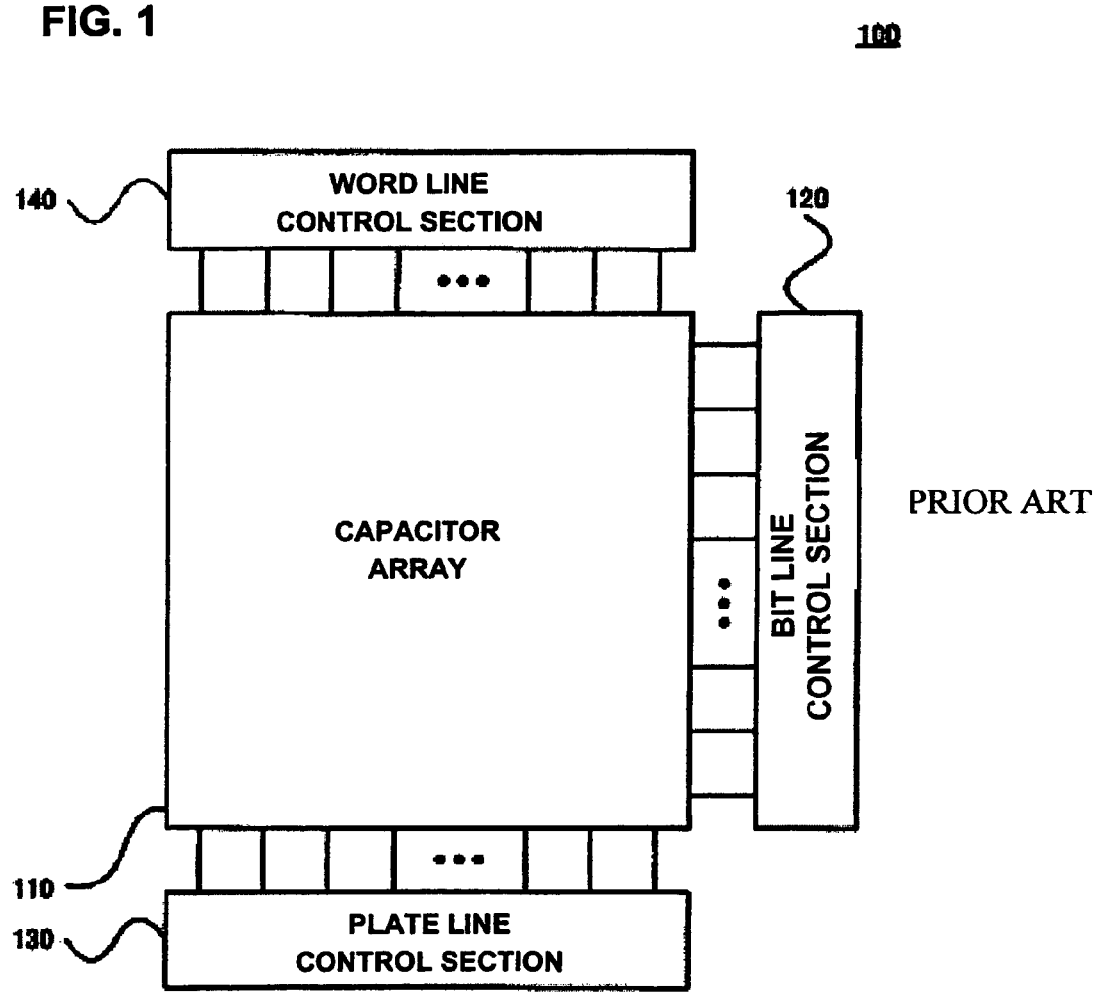
FIG. 1 is a block diagram showing the overall structure of a ferroelectric memory device 100 in accordance with the present invention.

FIG. 1 is a block diagram showing an example of the overall structure of a ferroelectric memory device 100 in accordance with the present invention. The ferroelectric memory device 100 is equipped with a capacitor array 110 with a plurality of ferroelectric capacitors arranged in an array configuration, a bit line control section 120, a plate line control section 130, and a word line control section 140.

The bit line control section 120 controls potentials on bit lines BL, and judges data written in ferroelectric capacitors Cp based on potentials on the bit lines BL. The plate line control section 130 controls potentials on plate lines PL. Also, the word line control section 140 controls potentials on word lines WL.

Figure 2:
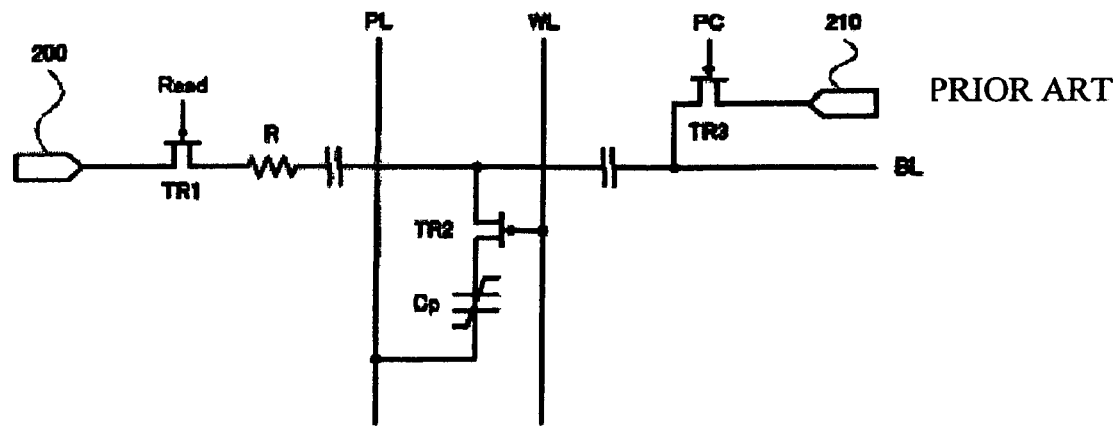
FIG. 2 is a diagram showing a part of a circuit structure of a capacitor array 110.

FIG. 2 is a diagram showing a part of a circuit structure of the capacitor array 110 in accordance with the first embodiment. The capacitor array 110 is equipped with a bit line BL, a plate line PL, a ferroelectric capacitor Cp, a constant voltage source 200 that is one example of a voltage source, a pre-charge voltage source 210, a resistor R1, and transistors TR1, TR2 and TR3, each of which is an example of a switch. It is noted that the capacitor array 110 has a plurality of ferroelectric capacitors Cp disposed in an array configuration which are electrically connected to corresponding bit lines BL and plate lines PL, but the structure and operations of the ferroelectric memory device 100 are described below by using one of the plurality of capacitors Cp as an example.

The ferroelectric capacitor Cp has one end electrically connected to the bit line BL through the transistor TR2, and the other end electrically connected to the plate line PL. In other words, one of a source and a drain of the transistor TR2 is connected to one end of the ferroelectric capacitor Cp, and the other is connected to the bit line BL. Also, a gate of the transistor TR2 is connected to the word line WL, whereby the transistor TR2 switches according to a change in the potential on the word line WL as to whether the bit line BL is electrically connected to the ferroelectric capacitor Cp.

The constant voltage source 200 generates a predetermined voltage to be supplied to the bit line BL. The constant voltage source 200 generates, for example, a voltage that is generally the same as a drive voltage VCC for driving the ferroelectric memory device 100. In this case, the constant voltage source 200 may be a drive voltage source that is provided in the ferroelectric memory device 100 for generating the drive voltage VCC.

In another example, the constant voltage source 200 may generate a voltage between the drive voltage VCC and a coercive voltage Vc to be described below, and may generate a voltage smaller than the coercive voltage Vc. Operations of the ferroelectric memory device 100, which take place when the constant voltage source 200 generates the voltage, and supplies the same to the bit line BL, are described below with reference to FIG. 7 and FIG. 8.

The resistance R1 is provided between the bit line BL and the constant voltage source 200. Also, the transistor TR1 is provided between the constant voltage source 200 and the bit line BL, and the voltage generated by the constant voltage source 200 is supplied to the bit line BL through the resistance R1. One of a source and a drain of the transistor TR1 is electrically connected to the constant voltage source 200, and the other is electrically connected to the resistance R1. Also, a signal Read is supplied to a gate of the transistor TR1, whereby the transistor TR1 switches based on a change in the potential of the signal Read as to whether the voltage is to be supplied to the bit line BL through the resistance R1.

It is noted that, in accordance with the present embodiment, the constant voltage source 200 is provided at an end section of the bit line BL through the transistor TR1 and the resistance R1, but, in another embodiment, it may be provided such that the predetermined voltage can be supplied to the bit line BL in an area between points at which a plurality of transistors TR2 are connected to the bit line BL. Also, the constant voltage source 200 may be provided such that the predetermined voltage can be supplied to the bit line BL in an area between a point at which the ferroelectric capacitor Cp is electrically connected to the bit line BL and a point at which the transistor TR3 is electrically connected thereto. In this case, the resistance R1 may preferably be provided between the constant voltage source 200 and the bit line BL, and the transistor TR1 may preferably be provided in series with the resistance R1.

The pre-charge voltage source 210 may be a voltage source that is composed in a manner that 0V is supplied to the bit line BL as the pre-charge voltage VPR. In other words, the capacitor array 110 may have a structure in which the bit line BL can be grounded through the transistor TR3, instead of the structure that is provided with the pre-charge voltage source 210.

Figure 3:
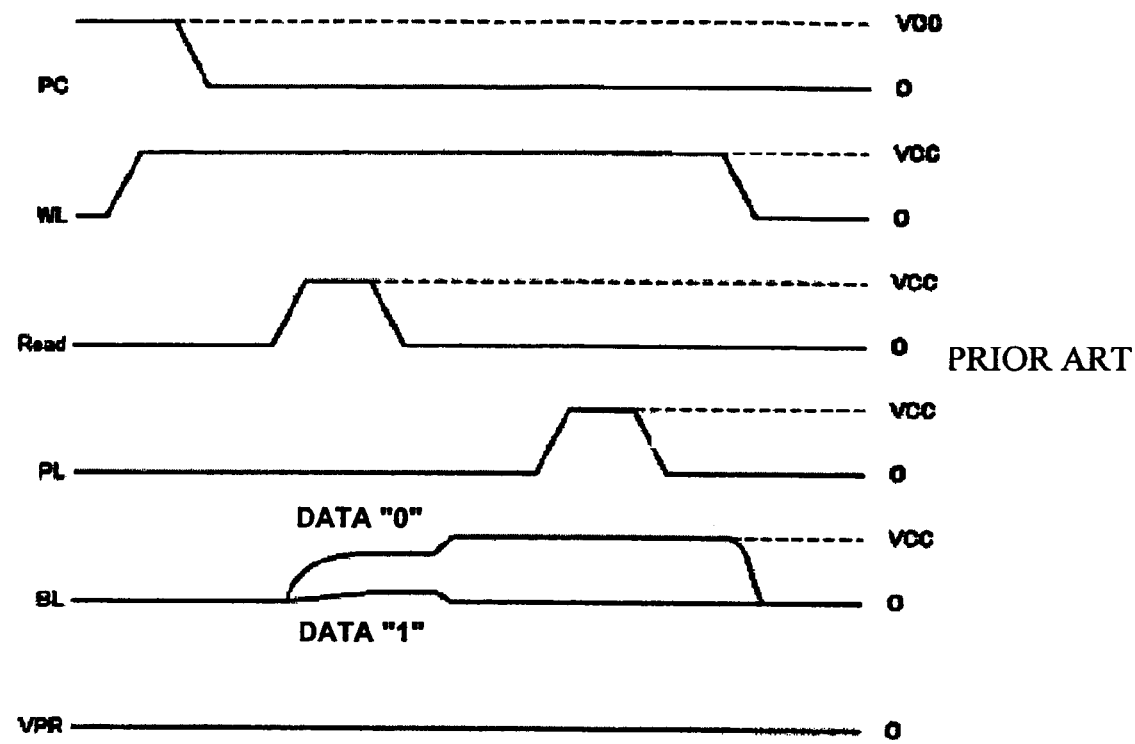
FIG. 3 is a timing chart showing a first embodiment example of a readout operation for reading data written in a ferroelectric capacitor Cp and a write operation for writing data therein in a ferroelectric memory device 100 in accordance with a present embodiment.

FIG. 3 is a timing chart showing a first embodiment example of a readout operation for reading data written in the ferroelectric capacitor Cp and a write operation for writing data therein in the ferroelectric memory device 100 in accordance with the present embodiment. In the present example, the constant voltage source 200 generates a drive voltage VCC as a voltage to be supplied to the bit line BL.

First, by setting the potential of a signal PC to VCC, the transistor TR3 is made conductive, to thereby pre-charge the bit line BL. In the present example, the pre-charge voltage source 210 generates 0V as a pre-charge voltage VPR, and the bit line BL is pre-charged to 0V.

Next, by changing the potential on the word line WL from 0V to VCC, the transistor TR2 is made conductive. By this, the potential on one end of the ferroelectric capacitor Cp becomes 0V, and because the potential on the plate line PL is also 0V, a potential difference between the two ends of the ferroelectric capacitor Cp becomes 0V.

Next, by setting the potential of the signal PC to 0V, the transistor TR3 is made non-conductive, to thereby place the bit line BL in a floating state. Then, the potential of the signal Read is set to VCC, to thereby make the transistor TR1 conductive. By this, VCC is supplied from the constant voltage source 200 to the bit line BL through the resistance R1, such that the bit line BL is gradually charged while its potential draws a predetermined charge waveform.

At this time, because the time constant of the ferroelectric capacitor Cp changes based on data written therein, the charge waveform of the bit line BL differs based on the data. Concretely, when the data written in the ferroelectric capacitor Cp is "0," the bit line BL defines a charge waveform in which its potential rises steeply, and when the data is "1," the bit line BL defines a charge waveform in which its potential rises more gently than the case where the data is "0." The charge waveforms are described below with reference to FIG. 4 and FIG. 5.

Next, after a predetermined period of time passes since the potential of the signal Read is set to VCC, the potential is set to 0V, whereby the transistor TR1 is made non-conductive. By this, the bit line BL is placed in a floating state, such that the potential on the bit line BL when the transistor TR1 is made non-conductive is retained. Concretely, a predetermined potential difference between the case where the data written in the ferroelectric capacitor Cp is "0" and the case where the data is "1" is generated on the bit line BL. Then, a sense amplifier (not shown) provided in the bit line control section 120 amplifies the potential on the bit line BL, and based on the amplified potential on the bit line BL, the data written in the ferroelectric capacitor Cp is judged.

Next, the potential on the plate line PL is changed from 0V to VCC, and then changed again to 0V, whereby data is rewritten in the ferroelectric capacitor Cp. Then, by setting the potential on the bit line BL and the word line WL to 0V, the readout and write operations are completed.

Figure 4:
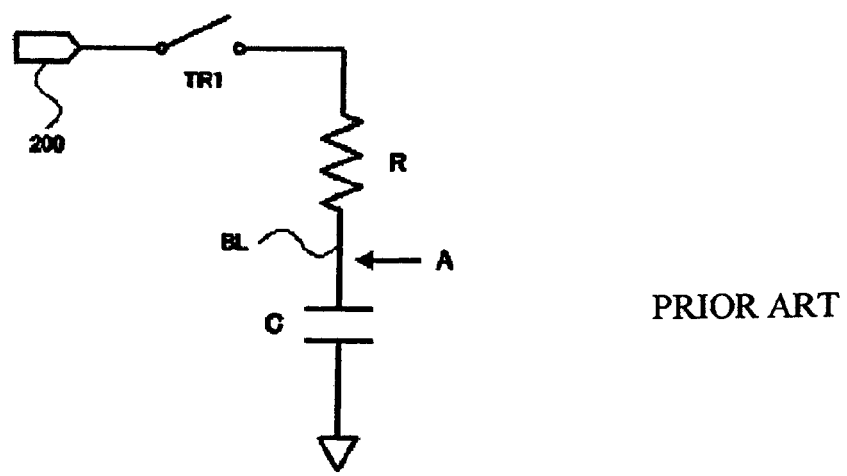
FIG. 4 is a diagram showing an equivalent circuit of the capacitor array 110.

FIG. 4 is a diagram showing an equivalent circuit of the capacitor array 110. Because the ferroelectric capacitor Cp has a capacitance C, the resistance R1, the ferroelectric capacitor Cp and the bit line BL in the capacitor array 110 of the present embodiment forms a RC series circuit as shown in the figure. It is noted here that, when the transistor TR3 is made conductive, and the voltage generated by the constant voltage source 200 is charged to the bit line BL, a potential Vt on the bit line BL after t seconds is expressed by Formula (1) as follows:

$$Vt = VCC \times (1 - e^{-t/CR}) \quad (1)$$

It is noted here that a time constant CR indicates the time during which the potential on the bit line BL rises to $(1-e^{-1})$, in other words, 63.2%, of the impressed voltage VCC. In other words, the greater the time constant CR, the more the charge time for charging the bit line BL becomes delayed. The time constant CR changes according to the capacitance C of the ferroelectric capacitor Cp, and therefore the charge time changes according to data written in the ferroelectric capacitor Cp. A description is made below as to how the capacitance C of the ferroelectric capacitor Cp changes according to data written in the ferroelectric capacitor Cp.

Figure 5:
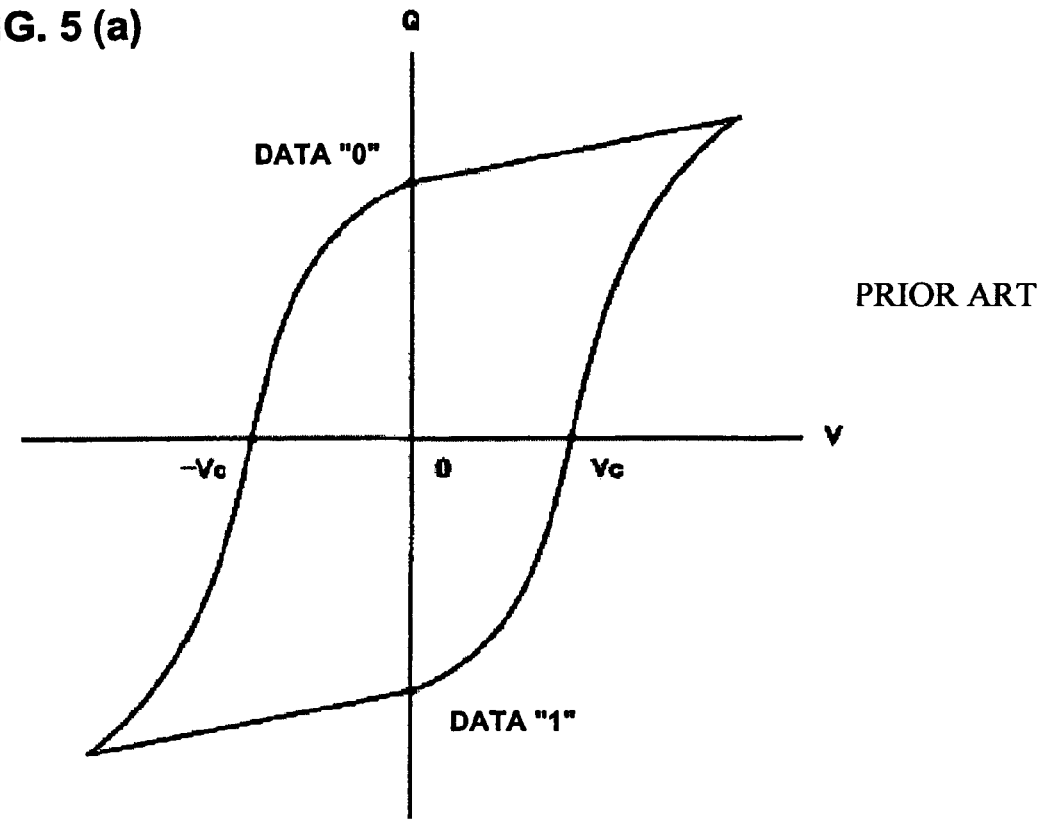
FIG. 5 shows graphs indicating Q-V hysteresis characteristics and C-V characteristics of the ferroelectric capacitor Cp.
Figure 5:
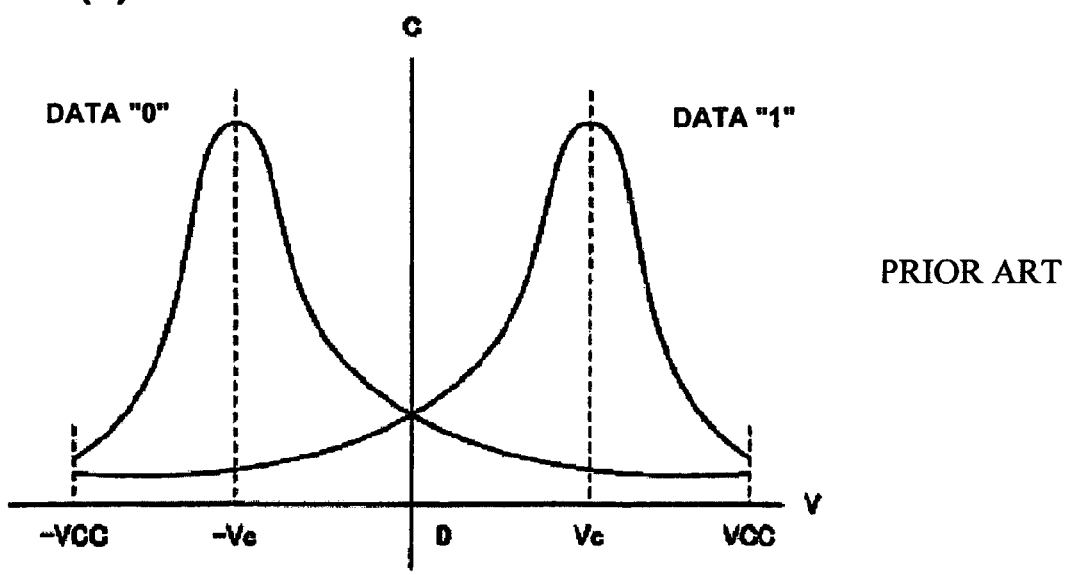

FIG. 5 are graphs showing Q-V hysteresis characteristics and C-V characteristics of the ferroelectric capacitor Cp. In the Q-V hysteresis characteristics of the ferroelectric capacitor Cp shown in FIG. 5(a), an inclination ($\Delta Q/\Delta V$) of the characteristic curve represents the capacitance C of the ferroelectric capacitor Cp, and the capacitance C exhibits a larger value when the inclination in the characteristic curve is steeper, and exhibits a smaller value when the inclination is gentler.

FIG. 5(b) is a graph showing C-V characteristics which indicate the capacitance C of the ferroelectric capacitor Cp with respect to the voltage V. As shown in the graph, the capacitance C changes according to data written in the ferroelectric capacitor Cp and the voltage V. In other words, when a positive voltage is gradually impressed from 0V to the ferroelectric capacitor Cp, the capacitance C gently reduces when the data written in the ferroelectric capacitor Cp is "0." On the other hand, when the data is "1," the capacitance C rapidly increases, reaches the maximum at the coercive voltage Vc that is a voltage when the polarization of the ferroelectric capacitor Cp becomes almost zero and at −Vc, and then rapidly reduces. Next, a description is made as to how the potential on the bit line BL changes according to changes in the capacitance C.

Figure 6:
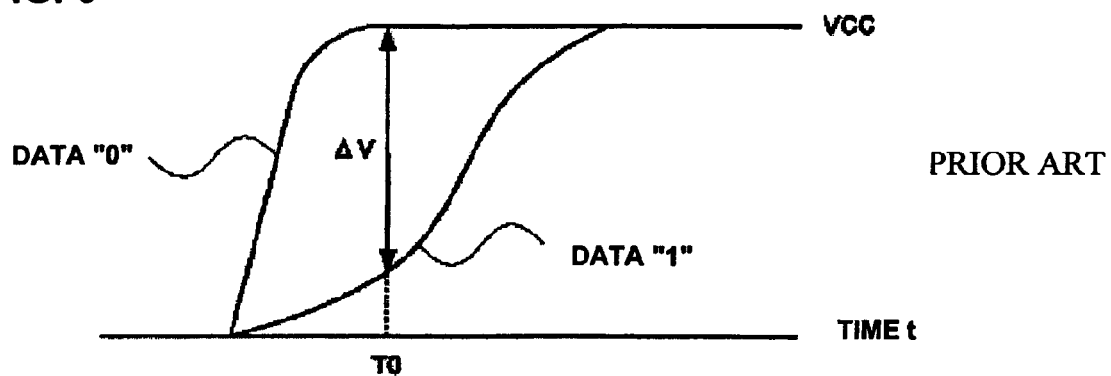
FIG. 6 is a graph showing the potential on a bit line BL with respect to a time t in supplying VCC to the bit line BL.

FIG. 6 is a graph showing the potential on the bit line BL with respect to a time t in supplying VCC to the bit line BL. As described above, the capacitance C of the ferroelectric capacitor Cp changes according to data written in the ferroelectric capacitor Cp. Accordingly, when VCC is supplied to the bit line BL through the resistance R1, the potential on the bit line BL rapidly increases when the data is "0," and gently increase when the data is "1." In other words, a potential difference ΔV is caused between the potentials on the bit line BL at a specified time T0 when the data is "0" and "1."

Referring to FIG. 3, when the potential of the signal Read is changed from 0V to VCC, charging to the bit line BL is started, and when the potential of the signal Read is changed from VCC to 0V, the charging to the bit line BL is stopped, whereby the bit line BL is placed in a floating state while retaining the potential at the time of stopping the charging. Accordingly, by stopping the charging to the bit line BL at a timing at which a predetermined potential difference is caused between the cases where the data is "0" and "1," the data written in the ferroelectric capacitor Cp can be judged.

Figure 7:
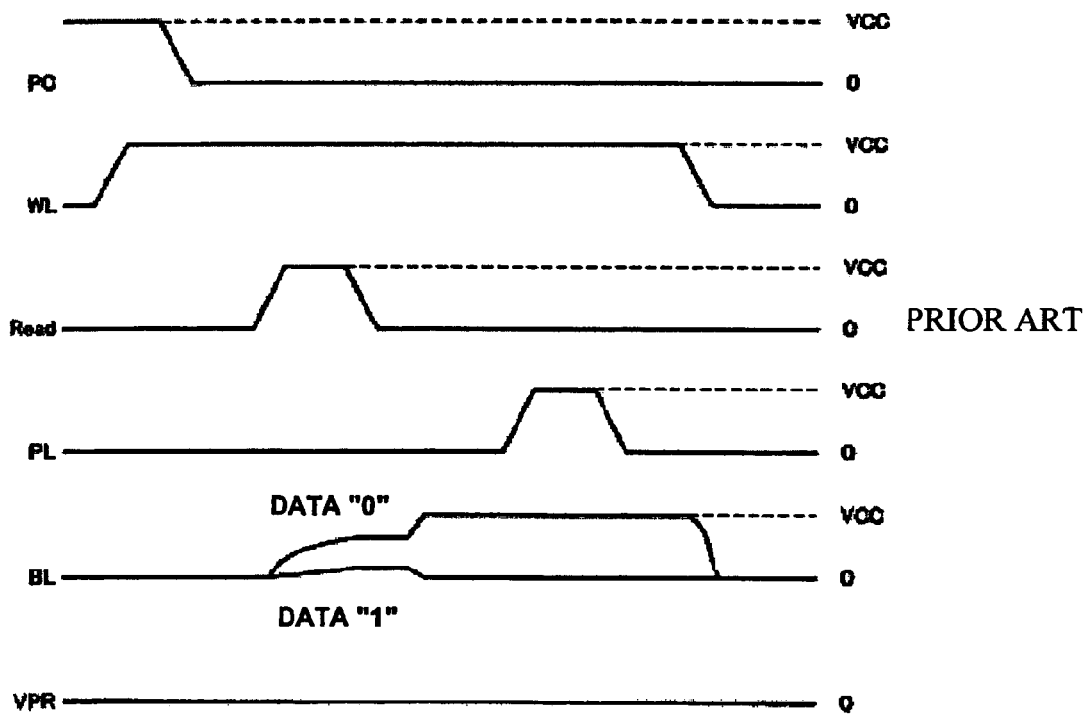
FIG. 7 is a timing chart showing a second embodiment example of a readout operation for reading data written in a ferroelectric capacitor Cp and a write operation for writing data therein in a ferroelectric memory device 100 in accordance with the present embodiment.

FIG. 7 is a timing chart showing a second embodiment example of a readout operation for reading data written in the ferroelectric capacitor Cp and a write operation for writing data therein in the ferroelectric memory device 100 in accordance with the present embodiment. In the present example, the readout operation and the write operation are similarly performed as those operations in the first embodiment example. However, the constant voltage source 200 in the present example generates a voltage between the coercive voltage Vc of the ferroelectric capacitor Cp and the drive voltage VCC. Accordingly, the voltage that is charged to the bit line BL in the present example is lower than the voltage in the first embodiment example, such that the voltage that is impressed to the ferroelectric capacitor Cp can be further lowered. Accordingly, deterioration of the ferroelectric composing the ferroelectric capacitor Cp can be further suppressed.

Figure 8:
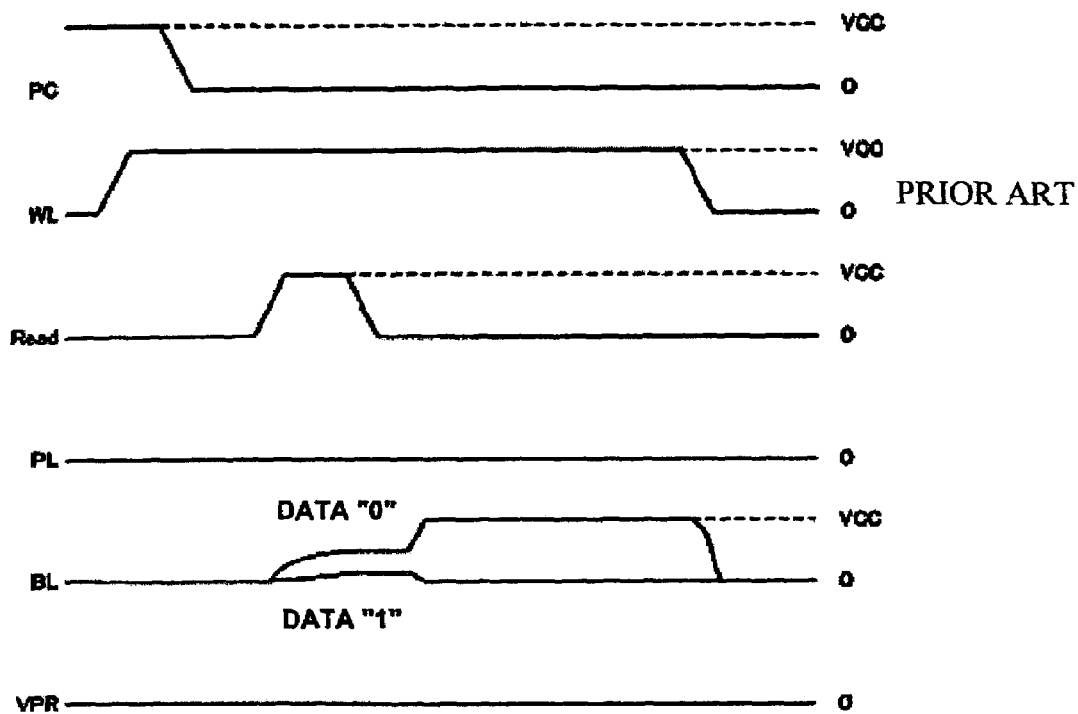
FIG. 8 is a timing chart showing a third embodiment example of a readout operation for reading data written in a ferroelectric capacitor Cp and a write operation for writing data therein in a ferroelectric memory device 100 in accordance with the present embodiment.

FIG. 8 is a timing chart showing a third embodiment example of a readout operation for reading data written in the ferroelectric capacitor Cp and a write operation for writing data therein in the ferroelectric memory device 100 in accordance with the present embodiment.

In the present example, the readout operation is similarly performed as those operations in the first embodiment example and the second embodiment example. However, the constant voltage source 200 in the present example generates a voltage lower than the coercive voltage Vc of the ferroelectric capacitor Cp. In other words, a voltage higher than the coercive voltage Vc is not supplied to the ferroelectric capacitor Cp. Accordingly, data written in the ferroelectric capacitor Cp would not be destroyed by the readout operation, such that a re-writing operation for changing the potential on the plate line PL from 0V to VCC does not have to be performed.

According to the present example, a re-writing operation becomes unnecessary, and thus the power consumption by the ferroelectric capacitor Cp can be reduced. Also, as the re-writing operation becomes unnecessary, fatigue of the ferroelectric composing the ferroelectric capacitor Cp can be suppressed.

Figure 9:
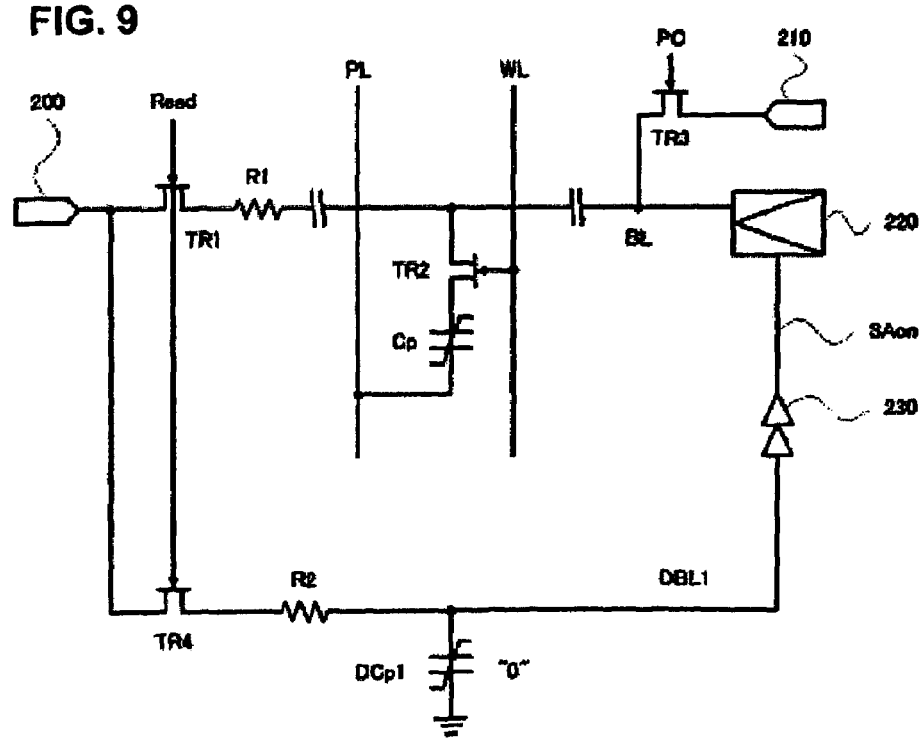
FIG. 9 is a diagram showing a part of a circuit structure of a capacitor array 110 in accordance with a second embodiment.

FIG. 9 is a diagram showing a part of a circuit structure of a capacitor array 110 in accordance with a second embodiment. A ferroelectric memory device 100 in accordance with the second embodiment is described below, focusing on its differences from the first embodiment. It is noted that components appended with the same codes as those of the first embodiment have functions similar to those of the first embodiment.

In the present embodiment, the capacitor array 110 is different from the first embodiment in that a signal SAon indicating the timing for judging data written in the ferroelectric capacitor Cp is generated. Concretely, the capacitor array 110 of the present embodiment is further equipped with, in addition to the circuit structure of the first embodiment, a first dummy bit line DBL1, a first dummy ferroelectric capacitor DCp1, a resistance R2, a transistor TR4 that is an example of a switch, a sense amplifier 220, and a buffer 230 that is an example of a waveform shaping section.

The first dummy ferroelectric capacitor DCp1 has one end connected to the first dummy bit line DBL1, and the other end grounded. In the present embodiment, the first dummy ferroelectric capacitor DCp1 is formed to have generally the same area and capacitance as those of the other ferroelectric capacitor Cp. In another example, the first dummy ferroelectric capacitor DCp1 may be connected to the first dummy bit line DBL1 through a switch such as a transistor. In this case, the switch may preferably be controlled according to operations of the transistor TR2 that is connected to the ferroelectric capacitor Cp.

The resistance R2 is provided between the first dummy bit line DBL1 and the constant voltage source 200. Also, the transistor TR4 is provided between the constant voltage source 200 and the first dummy bit line DBL1, and switches as to whether a voltage generated by the constant voltage source 200 is to be supplied to the first dummy bit line DBL1 through the resistance R2. One of a source and a drain of the transistor TR4 is electrically connected to the constant voltage source 200, and the other is electrically connected to the resistance R2. Also, a signal Read is supplied to a gate of the transistor TR4, whereby the transistor TR4 switches based on a change in the potential of the signal Read as to whether the voltage is to be supplied to the first dummy bit line DBL1 through the resistance R2. In other words, in the present embodiment, the transistor TR4 switches in synchronism with operations of the transistor TR1 as to whether the voltage is to be supplied to the first dummy bit line DBL1.

The resistance value of the resistance R2 may preferably be set based on the hysteresis characteristics of the ferroelectric capacitor Cp and/or the first dummy ferroelectric capacitor DCp1. As described with reference to FIG. 5, the capacitance (paraelectric capacitance) of the ferroelectric capacitor Cp and the first dummy ferroelectric capacitor DCp1 changes according to the inclination of the hysteresis characteristics.

For example, when the inclination of the hysteresis characteristics is larger, the capacitance of the ferroelectric capacitor Cp and the first dummy ferroelectric capacitor DCp1 becomes larger, compared to the case where the inclination of the hysteresis characteristics is smaller, and therefore the time constant of the bit line BL and the dummy bit line DBL1 becomes larger. In other words, when a predetermined voltage is supplied to the bit line BL and the first dummy bit line DBL1, the potential on the bit line BL and the first dummy bit line DBL1 gently rises when the inclination of their hysteresis characteristics is large and, on the other hand, the potential on the bit line BL and the first dummy bit line DBL1 rapidly rises when the inclination is small.

Accordingly, although a potential difference ΔV is generated in the potentials on the bit line BL in the cases where the data written in the ferroelectric capacitor Cp is "1" and "0," the timing at which the potential difference ΔV reaches the maximum value changes according to the hysteresis characteristics of the ferroelectric capacitor Cp. Accordingly, the resistance value of the resistance R2 may preferably be set to a value such that the potential difference ΔV reaches the maximum value or a sufficient readout margin can be obtained at a timing when the sense amplifier 220 operates according to the hysteresis characteristics.

The buffer 230 receives as an input the potential on the first dummy bit line DBL1, and generates a potential signal SAon in which the waveform of the potential is shaped. In accordance with the present embodiment, the buffer 230 outputs 0V as the potential signal SAon when the potential on the first dummy bit line DBL1 is lower than a predetermined potential, and outputs VCC as the potential signal SAon when the potential on the first dummy bit line DBL1 is higher than the predetermined potential. The predetermined potential may be a potential that is generally equal to the potential at which the sense amplifier 220 starts its operation.

In accordance with the present embodiment, the capacitor array 110 is formed from buffers 230 in multiple stages. Also, each of the buffers 230 functions as a delay element, and the delay time of the potential signal SAon with respect to the potential waveform may be adjusted by changing the number of stages of the buffers 230.

The sense amplifier 220 judges data written in the ferroelectric capacitor Cp based on the potential on the bit line BL according to the timing at which the potential of the potential signal SAon changes. In other words, in accordance with the present embodiment, the sense amplifier 220 receives the potential signal SAon as an enable signal.

Figure 10:
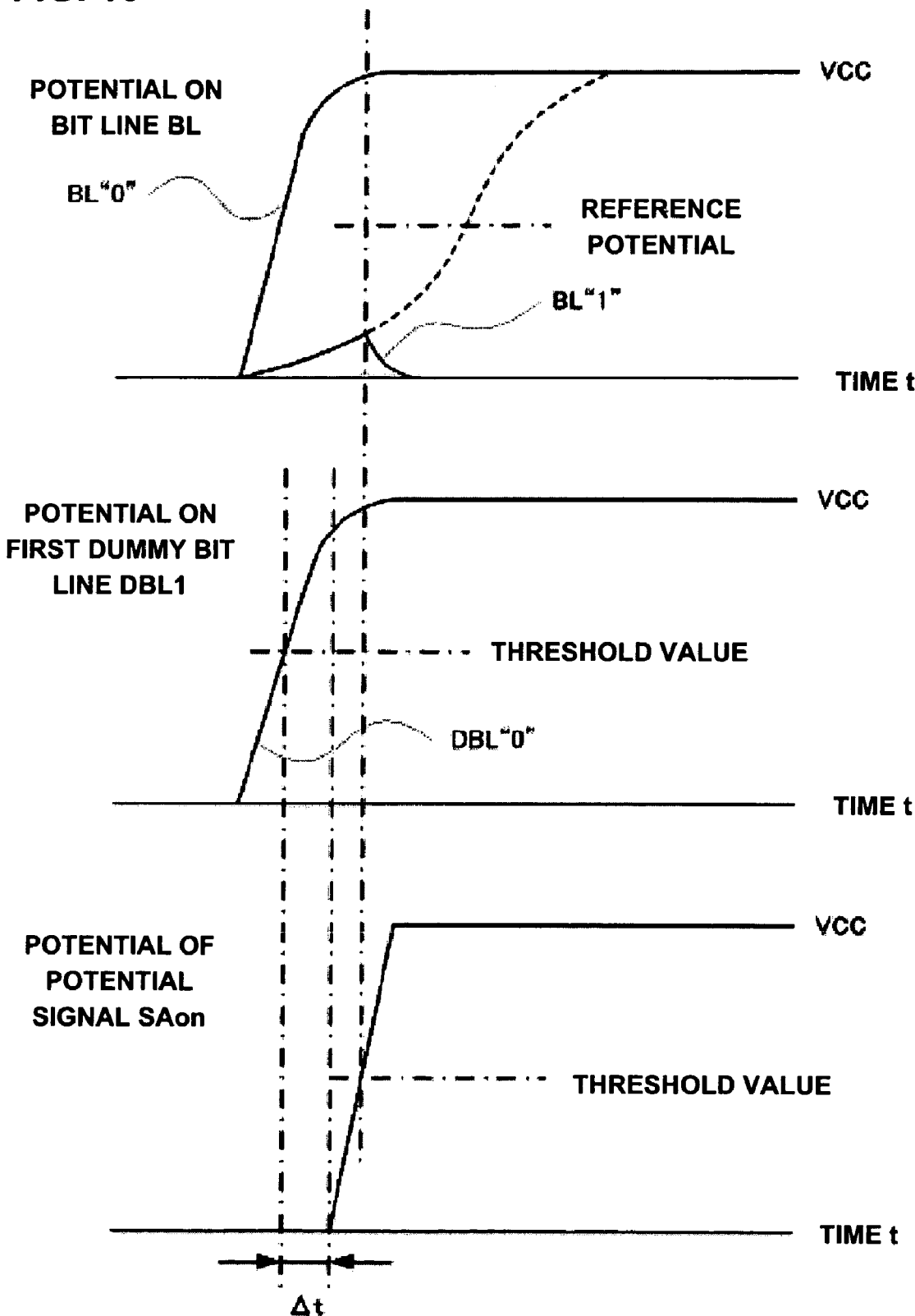
FIG. 10 shows graphs indicating potentials on a bit line BL and a first dummy bit line DBL1, and of a potential signal SAon with respect to a time t in supplying VCC to the bit line BL and the first dummy bit line DBL1.

FIG. 10 shows graphs indicating potentials on the bit line BL and the first dummy bit line DBL1, and of the potential signal SAon with respect to a time t in supplying VCC to the bit line BL and the first dummy bit line DBL1. The ferroelectric memory device 100 of the present embodiment performs operations similar to those of the first embodiment, and therefore the operations of the ferroelectric memory device 100 of the present embodiment are described below, focused on changes in the potential on the first dummy bit line DBL1.

First, like the first embodiment, the bit line BL and the first dummy bit line DBL1 are pre-charged to 0V, to put them in a floating state. Next, the potential of the signal Read is changed from 0V to VCC, whereby the transistors TR1 and TR4 are made conductive. By this, VCC is supplied from the constant voltage source 200 to the bit line BL and the first dummy bit line DBL1 through the resistances R1 and R2, respectively, such that the potentials on the bit line BL and the first dummy bit line DBL1 are gradually charged, while drawing predetermined charge waveforms, as shown in FIG. 10.

In accordance with the present embodiment, the resistance R2 has a resistance value that is generally equal to that of the resistance R1, and data "0" is written in the first dummy ferroelectric capacitor DCp1. Also, the capacitance of the bit line BL is generally equal to the capacitance of the first dummy bit line DBL1. For this reason, the potential on the first dummy bit line DBL1 rises like the potential on the bit line BL when the data written in the ferroelectric capacitor Cp is "0."

When the potential on the first dummy bit line DBL1 exceeds a threshold value of the buffer 230, the buffer 230 outputs VCC as the potential signal SAon. In the present embodiment, the buffer 230 also functions as a delay element, and therefore changes the potential of the potential signal SAon from 0V to VCC when a time Δt passes after the potential on the first dummy bit line DBL1 exceeds the threshold value.

Next, when the potential of the potential signal SAon exceeds a threshold value of the sense amplifier 220, the sense amplifier 220 starts its operation. When the potential of the potential signal SAon exceeds the threshold value, the sense amplifier 220 compares the potential on the bit line BL with a reference voltage, to thereby judge data written in the ferroelectric capacitor Cp. The sense amplifier 220 judges that the data written in the ferroelectric capacitor Cp is "0" when the potential on the bit line BL is higher than the reference voltage. On the other hand, the amplifier 220 judges that the data written in the ferroelectric capacitor Cp is "1" when the potential on the bit line BL is lower than the reference voltage.

In accordance with the present embodiment, the operation of the sense amplifier 220 can be started according to a timing at which the potential on the first dummy bit line DBL1 changes when a predetermined voltage is supplied to the bit line BL and the first dummy bit line DBL1. The timing is determined by the time constant of the first dummy bit line DBL1, in other words, by the characteristics of the second resistance and the first dummy ferroelectric capacitor DCp1 connected to the first dummy bit line DBL1. For example, even when characteristics of the first resistance and the ferroelectric capacitor Cp which affect the time constant of the bit line BL change, the time constant of the first dummy bit line DBL1 also changes according to the change. Accordingly, in accordance with the present embodiment, the ferroelectric memory device 100 that can perform a stable readout operation even when the characteristics of the ferroelectric capacitor change can be provided.

In accordance with the present embodiment, the sense amplifier 220 judges data written in the ferroelectric capacitor Cp based on a timing at which the potential of the potential waveform changes. Also, the timing is determined by an operation to shape the potential waveform performed by the buffer 230. Accordingly, in accordance with the present embodiment, the buffer 230 can set the timing to a desired timing, such that the readout operation can be further stabilized.

Figure 11:
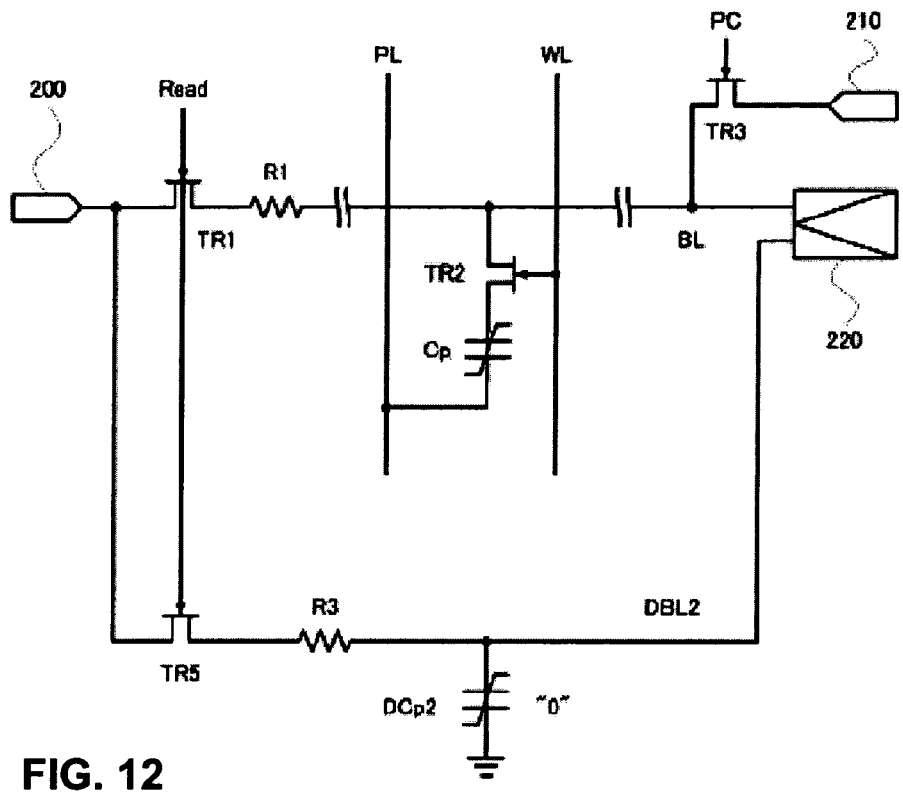
FIG. 11 is a diagram showing a part of a circuit structure of a capacitor array 110 in accordance with a third embodiment.

FIG. 11 is a diagram showing a part of a circuit structure of a capacitor array 110 in accordance with a third embodiment. A ferroelectric memory device 100 in accordance with the third embodiment is described below, focusing on differences from the first embodiment and/or the second embodiment. It is noted that components appended with the same codes as those of the first embodiment and/or the second embodiment have functions similar to those of these embodiments.

In the present embodiment, the capacitor array 110 has a structure that generates a reference voltage for judging data written in the ferroelectric capacitor Cp, which is different from the first embodiment and the second embodiment. Concretely, the capacitor array 110 in accordance with the present embodiment is further equipped with, in addition to the circuit structure of the first embodiment, a second dummy bit line DBL2, a second dummy ferroelectric capacitor DCp2, a resistance R3, a transistor TR5 that is an example of a switch, and a sense amplifier 220.

The second dummy ferroelectric capacitor DCp2 has one end connected to the second dummy bit line DBL2, and the other end grounded. In the present embodiment, the second dummy ferroelectric capacitor DCp2 is formed to have generally the same area and capacitance as those of the other ferroelectric capacitor Cp. In another example, the second dummy ferroelectric capacitor DCp2 may be connected to the second dummy bit line DBL2 through a switch such as a transistor. In this case, the switch may preferably be controlled according to operations of the transistor TR2 that is connected to the ferroelectric capacitor Cp.

The resistance R3 is provided between the second dummy bit line DBL2 and the constant voltage source 200. Also, the transistor TR5 is provided between the constant voltage source 200 and the second dummy bit line DBL2, and switches as to whether a voltage generated by the constant voltage source 200 is to be supplied to the second dummy bit line DBL2 through the resistance R3. One of a source and a drain of the transistor TR5 is electrically connected to the constant voltage source 200, and the other is electrically connected to the resistance R3. Also, a signal Read is supplied to a gate of the transistor TR5, whereby the transistor TR5 switches based on a change in the potential of the signal Read as to whether the voltage is to be supplied to the second dummy bit line DBL2 through the resistance R3. In other words, in the present embodiment, the transistor TR5 switches in synchronism with operations of the transistor TR1 as to whether the voltage is to be supplied to the second dummy bit line DBL2.

The resistance value of the resistance R3 is set based on data written in the second dummy ferroelectric capacitor DCp2. Concretely, the resistance value of the resistance R3 may preferably be set to be a value by which the time constant of the second dummy bit line DBL2 can be derived from Formula (2) as follows:

$$R1 \times (2CBL + Cp\ \text{``1''} + Cp\ \text{``0''})/2 \qquad (2)$$

where, CBL is a capacitance of the bit line BL, Cp "1" is a capacitance of the ferroelectric capacitor Cp when data "1" is written therein, and Cp "0" is a capacitance of the ferroelectric capacitor Cp when data "0" is written therein.

It is noted that the resistance value of the resistance R3 may be a resistance value that makes the time constant of the second dummy bit line DBL2 smaller than the time constant of the bit line BL when data "1" is written in the ferroelectric capacitor Cp, and greater than the time constant of the bit line BL when data "0" is written in the ferroelectric capacitor Cp.

In the present embodiment, because data "0" is written in the second dummy bit line DBL2, the resistance value of the resistance R3 is set to be greater than the resistance value of the resistance R1. The resistance value of the resistance R3 may preferably be set to be a resistance value by which the time constant of the second dummy bit line DBL2 becomes smaller than a value derived from Formula (2).

In the present embodiment, the constant voltage source 200 is provided at an end section of the second dummy bit line DBL2 through the transistor TR5 and the resistance R3, but in another embodiment, it may be provided such that a predetermined voltage can be supplied to the second dummy bit line DBL2 in an area between a point where the second dummy ferroelectric capacitor DCp2 is connected to the dummy bit line DBL2 and the sense amplifier 220. In this case, the resistance R3 may preferably be provided between the constant voltage source 200 and the second dummy bit line DBL2, and the transistor TR5 may preferably be provided in series with the resistance R3.

The second dummy bit line DBL2 has one end connected to the constant voltage source 200 through the resistance R3 and the transistor TR5, and the other end connected to the sense amplifier 220. The sense amplifier 220 is connected to the bit line BL and the other end of the second dummy bit line DBL2, and judges data written in the ferroelectric capacitor Cp based on potentials on the bit line BL and the second dummy bit line DBL2.

One second dummy bit line DBL2 may preferably be provided for a plurality of bit lines BL. For example, the second dummy bit line DBL2 may be provided for each block of bit lines BL, or a single second dummy bit line may be provided for the ferroelectric memory device 100.

Figure 12:
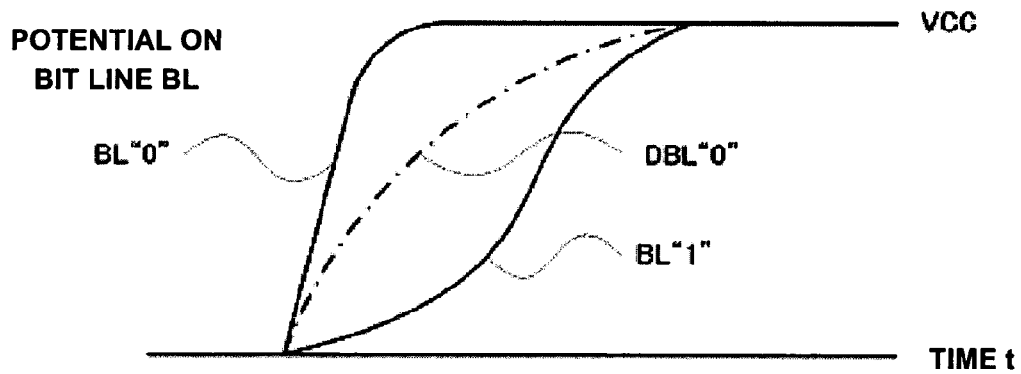
FIG. 12 shows graphs indicating potentials on a bit line BL and a second dummy bit line DBL2 with respect to a time t in supplying VCC to the bit line BL and the second dummy bit line DBL2.
Figure 12:
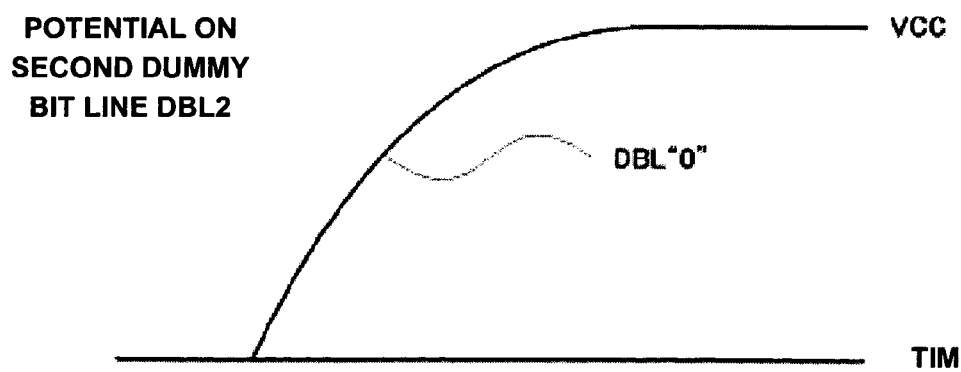

FIG. 12 shows graphs indicating potentials on the bit line BL and the second dummy bit line DBL2 with respect to a time t in supplying VCC to the bit line BL and the second dummy bit line DBL2. The ferroelectric memory device 100 of the present embodiment performs operations similar to those of the first embodiment, and therefore operations of the ferroelectric memory device 100 in accordance with the present embodiment are described, focusing on changes in the potential on the second dummy bit line DBL2.

First, like the first embodiment, the bit line BL and the second dummy bit line DBL2 are pre-charged to 0V, to put them in a floating state. Next, the potential of the signal Read is changed from 0V to VCC, whereby the transistors TR1 and TR5 are made conductive. By this, VCC is supplied from the constant voltage source 200 to the bit line BL and the second dummy bit line DBL2 through the resistances R1 and R5, respectively, such that the potentials on the bit line BL and the second dummy bit line DBL2 are gradually charged, while drawing predetermined charge waveforms, as shown in FIG. 12.

Data "0" is written in the second dummy bit line DBL2, and the resistance value of the resistance R3 is greater than the resistance value of the resistance R1. Accordingly, the time constant of the second dummy bit line DBL2 is greater than the time constant of the bit line BL when data "0" is written in the ferroelectric capacitor Cp, and smaller than the time constant of the bit line BL when data "1" is written therein. For this reason, the potential on the second dummy bit line DBL2 rises faster than that on the bit line BL when data written in the ferroelectric capacitor Cp is "1" and rises slower than that on the bit line BL when the data is "0."

Next, after the potential on the bit line BL and/or the second dummy bit line DBL2 starts rising, the sense amplifier 220 compares the potential on the second dummy bit line DBL2 with the potential on the bit line BL at a predetermined timing, to thereby judge data written in the ferroelectric capacitor Cp. The sense amplifier 220 judges that the data written in the ferroelectric capacitor Cp is "0" when the potential on the bit line BL is higher than the potential on the second dummy bit line DBL2. On the other hand, the sense amplifier 220 judges that the data written in the ferroelectric capacitor Cp is "1" when the potential on the bit line BL is lower than the potential on the second dummy bit line DBL2.

In the present embodiment, because the second dummy bit line DBL2 has a time constant different from that of the bit line BL, the charge characteristic of the second dummy bit line DBL2 is different from the charge characteristic of the bit line BL, when a predetermined voltage is supplied from the voltage source. Then, the sense amplifier 220 judges data written in the ferroelectric capacitor Cp based on a difference between these charge characteristics. In other words, the potential on the bit line BL is different from the potential on the second dummy bit line DBL2 at a predetermined timing after a predetermined voltage is supplied to the bit line BL and the second bit line DBL2, and the sense amplifier 220 can judge data written in the ferroelectric capacitor Cp based on the potential difference.

Therefore, in accordance with the present embodiment, a stable readout operation can be achieved with a considerably simple structure. Also, even when the characteristics of the ferroelectric capacitor change due to fluctuations in the process, differences in the process, changes in the operation temperature, changes in the power supply voltage, a stable operation to readout the data can be realized.

In accordance with the present embodiment, to retain data "0" in the second dummy ferroelectric capacitor DCp2, the potential on one end thereof is set to be higher than that on the other end. Then, when data written in the ferroelectric capacitor Cp is to be judged, a predetermined voltage is supplied to the second dummy bit line DBL2 for generating a reference voltage, and the predetermined voltage sets the potential on the one end of the second dummy ferroelectric capacitor DCp2 higher than that on the other end, whereby data "0" can be retained in the second dummy ferroelectric capacitor DCp2. Accordingly, in accordance with the present embodiment, reference voltage data can be retained in the second dummy ferroelectric capacitor DCp2 with a considerably simple structure.

In accordance with the present embodiment, when data written in the ferroelectric capacitor Cp is to be judged, a predetermined voltage is supplied to the second dummy bit line DBL2 for generating a reference voltage, and the predetermined voltage is impressed to the second dummy ferroelectric capacitor DCp2. In other words, in the present embodiment, data "0" written as reference voltage data is not destroyed, and therefore a rewrite operation to the second dummy ferroelectric capacitor DCp2 does not have to be performed. Accordingly, in accordance with the present embodiment, reference voltage data can be retained very easily in the second dummy ferroelectric capacitor DCp2.

In accordance with the present embodiment, the time constant of the second dummy bit line DBL2 becomes a value between the time constant of the bit line BL when data "0" is written in the ferroelectric capacitor Cp and the time constant of the bit line BL when data "1" is written therein. In other words, the potential on the second dummy bit line DBL2 when a predetermined voltage is supplied to the bit line BL and the second dummy bit line DBL2 becomes a value between the potential on the bit line BL when data "0" is written in the ferroelectric capacitor Cp and the potential on the bit line BL when data "1" is written therein. Therefore, in accordance with the present embodiment, data written in the ferroelectric capacitor Cp can be accurately judged based on the potential on the second dummy bit line DBL2.

In accordance with the present embodiment, the potential on the second dummy bit line DBL2 when a predetermined voltage is supplied to the bit line BL and the second dummy bit line DBL2 becomes generally a center value between the potential on the bit line BL when data "0" is written in the ferroelectric capacitor Cp and the potential on the bit line BL when data "1" is written therein. Therefore, in accordance with the present embodiment, the reference voltage can be given a greater margin, such that data written in the ferroelectric capacitor Cp can be more accurately judged.

In accordance with the present embodiment, the potential on the second dummy bit line DBL2 when a predetermined voltage is supplied to the bit line BL and the second dummy bit line DBL2 may become a value smaller than a generally center value between the potential on the bit line BL when data "0" is written in the ferroelectric capacitor Cp and the potential on the bit line BL when data "1" is written therein. Therefore, in accordance with the present embodiment, even when the potential on the bit line BL when data "1" is written in the ferroelectric capacitor Cp lowers by the fatigue characteristics, the data written in the ferroelectric capacitor Cp can be accurately judged.

Figure 13:
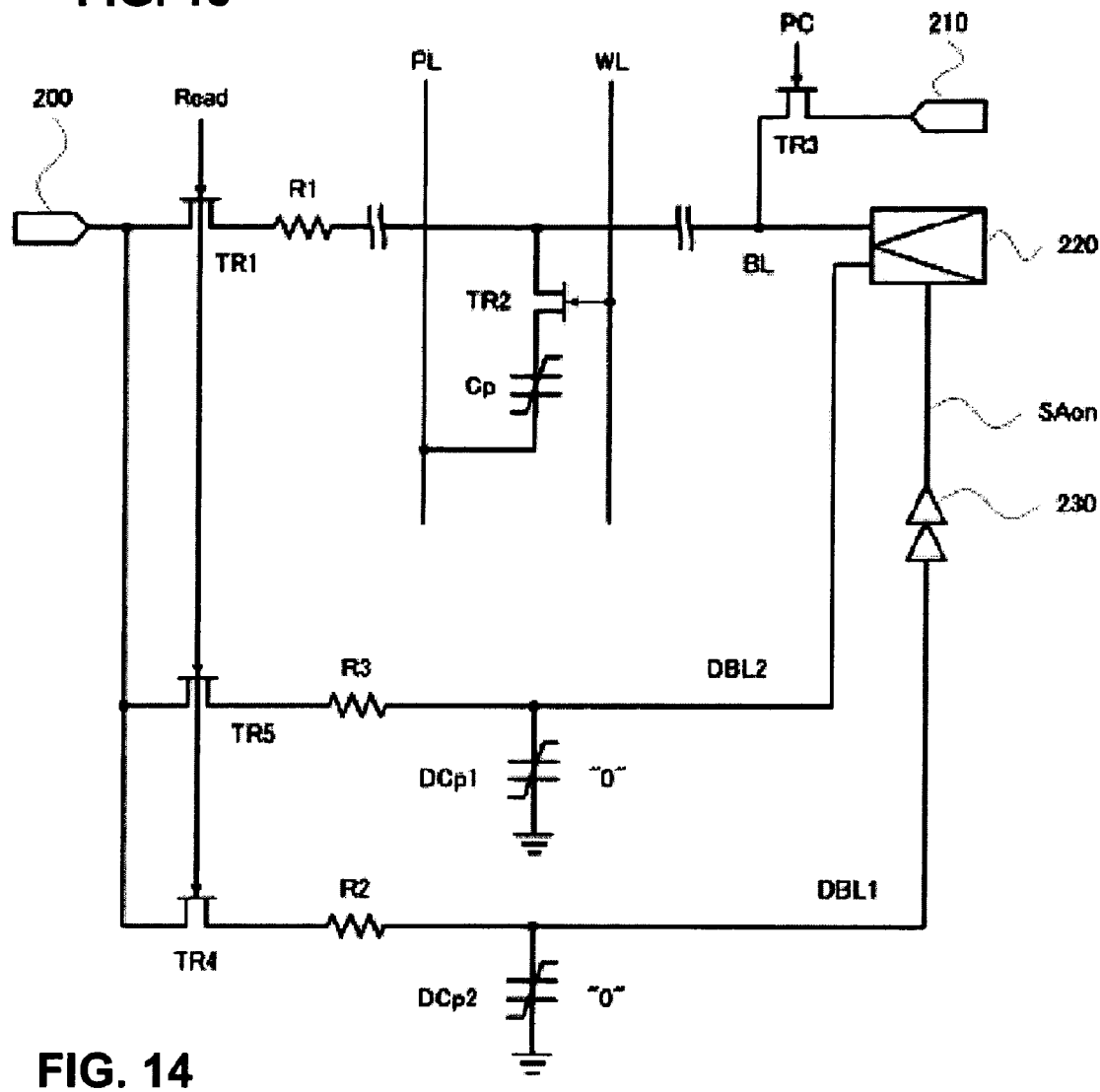
FIG. 13 is a diagram showing a part of a circuit structure of a capacitor array 110 in accordance with a fourth embodiment.

FIG. 13 is a diagram showing a part of a circuit structure of a capacitor array 110 in accordance with a fourth embodiment. In the present embodiment, the capacitor array 110 has both of the structure of the second embodiment and the structure of the third embodiment. More specifically, the capacitor array 110 of the present embodiment is equipped with, in addition to the structure of the first embodiment, a first dummy bit line DBL1 and a second dummy bit line DBL2, resistors R2 and R3, transistors TR4 and TR5, a first dummy ferroelectric capacitor DCp1 and a second dummy ferroelectric capacitor DCp2, a sense amplifier 220, and a buffer 230.

Each of the components of the present embodiment has a structure similar to the structure described above in the first embodiment through the third embodiment and similar functions. Furthermore, components appended with the same codes as those of any one or all of the first embodiment through the third embodiment have functions similar to those of these embodiments. In other words, in accordance with the present embodiment, the sense amplifier 220 compares the potential on the bit line BL and the potential on the second dummy bit line DBL2, to thereby judge data written in the ferroelectric capacitor Cp, according to a timing at which the potential of a potential signal SAon outputted from the buffer 230 changes.

In accordance with the present embodiment, at a timing at which a potential difference ΔV, in other words, a readout margin can be sufficiently obtained, data written in the ferroelectric capacitor Cp is judged with a potential between the potential on the bit line BL when data written in the ferroelectric capacitor Cp is "0" and the potential on the bit line BL when it is "1" as a reference potential, such that a more stable readout operation can be achieved.

Figure 14:
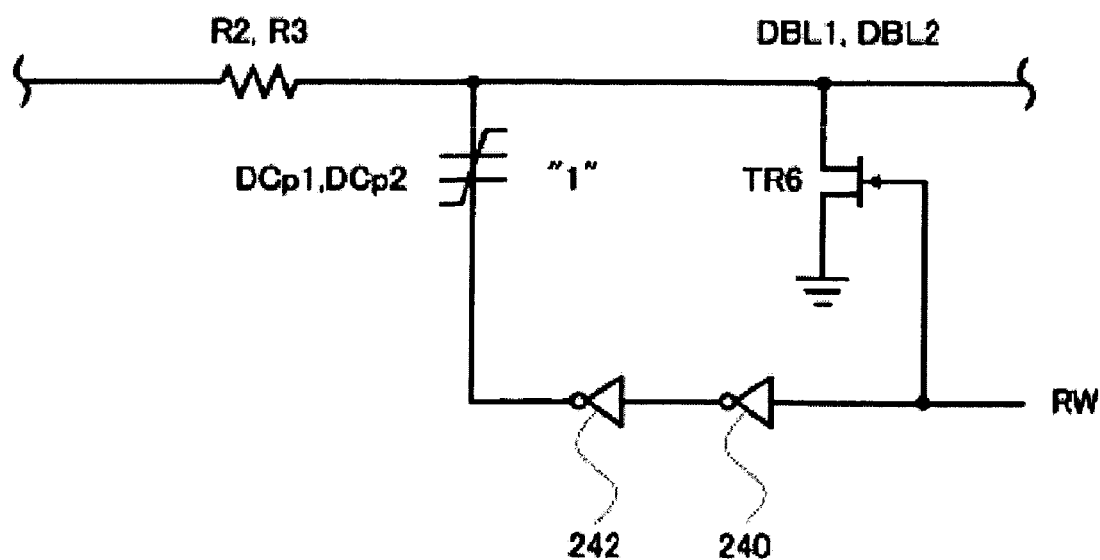
FIG. 14 is a diagram showing an example of a structure for retaining data "1" in the first dummy ferroelectric capacitor DCp1 and the second dummy ferroelectric capacitor DCp2, in accordance with the second embodiment through the fourth embodiment.

FIG. 14 is a diagram showing an example of a structure for retaining data "1" in the first dummy ferroelectric capacitor DCp1 and the second dummy ferroelectric capacitor DCp2, in accordance with the second embodiment through the fourth embodiment.

In the present example, the capacitor array 110 is further equipped with a transistor TR6 and inverters 240 and 242. The transistor TR6 has a source grounded, and a drain connected to the first dummy bit line DBL1 and/or the second dummy bit line DBL2. An output of the inverter 242 is supplied to the other end of the first dummy ferroelectric capacitor DCp1 and/or the second dummy ferroelectric capacitor DCp2. Also, a rewrite signal RW is supplied to a gate of the transistor TR6 and an input of the inverter 240. The rewrite signal RW is a signal that has a potential at 0V at the time of a readout operation, and at VCC at the time of a rewrite operation.

In the present example, like the embodiments described above, data written in the ferroelectric capacitor Cp is read out. However, at the time of this readout operation, while the potential of the rewrite signal RW is 0V, the potential on the first dummy bit line DBL1 and/or the second dummy bit line DBL2 rises to VCC. Accordingly, data "1" written in the first dummy ferroelectric capacitor DCp1 and/or the second dummy ferroelectric capacitor DCp2 is destroyed.

For this reason, in the present example, data "1" is rewritten in the first dummy ferroelectric capacitor DCp1 and/or the second dummy ferroelectric capacitor DCp2, after data written in the ferroelectric capacitor Cp is read out. Concretely, the potential of the rewrite signal RW is changed from 0V to VCC, to thereby set the transistor TR6 to be conductive, and the potential on the first dummy bit line DBL1 and/or the second dummy bit line DBL2 to 0V. On the other hand, when the potential of the rewrite signal RW becomes VCC, the output from the inverter 242 changes from 0V to VCC, and a voltage of −VCC is applied to the first dummy ferroelectric capacitor DCp1 and/or the second dummy ferroelectric capacitor DCp2, with its one end as a reference, such that data "1" is rewritten in the first dummy ferroelectric capacitor DCp1 and/or the second dummy ferroelectric capacitor DCp2.

The embodiment examples and application examples described with reference to the embodiments of the present invention can be used by appropriately combining them depending on specific applications, or with changes or improvements added thereto, and the present invention is not limited to the descriptions of the above embodiments. It is obvious from the descriptions in the scope of patent claims that those combinations or the modes with added changes or improvements can be included in the technical range of the present invention.

What is claimed is:

1. A ferroelectric memory device comprising:
   a voltage source for generating a predetermined voltage;
   a first bit line and a second bit line;
   a first ferroelectric capacitor having one end electrically connected to the first bit line;
   a first resistor provided between the first bit line and the voltage source;
   a first switch provided between the voltage source and the first bit line, for switching as to whether the predetermined voltage is to be supplied for a predetermined period to the first bit line through the first resistor;
   a second ferroelectric capacitor having one end electrically connected to the second bit line;
   a second resistor provided between the second bit line and the voltage source;
   a second switch provided between the voltage source and the second bit line, for switching as to whether the predetermined voltage is to be supplied for a predetermined period to the second bit line through the second resistor; and
   a sense amplifier that judges data written in the first ferroelectric capacitor based on a potential on the first bit line, according to a timing at which a potential on the second bit line changes when the predetermined voltage is simultaneously supplied to both the first bit line and the second bit line.

2. A ferroelectric memory device according to claim 1, further comprising a waveform shaping section provided between the second bit line and the sense amplifier, for generating a potential signal of a shaped potential waveform on the second bit line, wherein
   the sense amplifier judges data written in the first ferroelectric capacitor based on a potential on the first bit line when a potential of the potential signal changes.

3. A ferroelectric memory device according to claim 1, further comprising:
   a third bit line;
   a third ferroelectric capacitor having one end electrically connected to the third bit line;
   a third resistor provided between the third bit line and the voltage source, and having a resistance value different from a resistance value of the first resistor; and
   a third switch provided between the voltage source and the third bit line, for switching as to whether the predetermined voltage is to be supplied for a predetermined period to the third bit line through the third resistor,
   wherein the sense amplifier compares, according to the timing, a potential on the first bit line when the predetermined voltage is supplied to the first bit line and the second bit line with a potential on the third bit line, to thereby judge data written in the first ferroelectric capacitor.

* * * * *